United States Patent
Chu et al.

(10) Patent No.: US 11,309,725 B2
(45) Date of Patent: Apr. 19, 2022

(54) SUPPORT BASE

(71) Applicant: Primax Electronics Ltd., Taipei (TW)

(72) Inventors: Wen-Chih Chu, Taipei (TW); Yi-Ting Chang, Taipei (TW); Yu-Chuan Liu, Taipei (TW); Wen-Hsien Chan, Taipei (TW); Yu-Cun Chu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 128 days.

(21) Appl. No.: 17/004,237

(22) Filed: Aug. 27, 2020

(65) Prior Publication Data

US 2021/0152000 A1    May 20, 2021

Related U.S. Application Data

(60) Provisional application No. 62/937,584, filed on Nov. 19, 2019.

(51) Int. Cl.
| | |
|---|---|
| *H01M 10/46* | (2006.01) |
| *H02J 7/00* | (2006.01) |
| *H04M 1/04* | (2006.01) |
| *H05K 7/20* | (2006.01) |
| *H02J 50/10* | (2016.01) |

(52) U.S. Cl.
CPC ............ *H02J 7/0044* (2013.01); *H02J 50/10* (2016.02); *H04M 1/04* (2013.01); *H05K 7/20154* (2013.01)

(58) Field of Classification Search
CPC ........ H02J 50/005; H02J 50/10; H02J 7/0044; H02J 7/0042; G06F 13/4068
USPC .......................... 320/107, 108, 111, 114, 115
See application file for complete search history.

(56) References Cited

U.S. PATENT DOCUMENTS

| | | | |
|---|---|---|---|
| 2019/0123588 A1* | 4/2019 | Kim ..................... | H02J 50/12 |
| 2020/0251928 A1* | 8/2020 | Ha ....................... | H04M 1/02 |
| 2020/0259347 A1* | 8/2020 | Pereira ................ | G09G 5/10 |
| 2021/0210982 A1* | 7/2021 | Wallace .............. | G06F 1/1632 |

* cited by examiner

*Primary Examiner* — Edward Tso
(74) *Attorney, Agent, or Firm* — Kirton McConkie; Evan R. Witt

(57) ABSTRACT

A support base includes a casing, a signal transmission module, a connection port, an audio output element and a detecting module. The support base is connected with a portable electronic device through the signal transmission module. The support base is connected with an external electronic device through the connection port. A first audio signal from the portable electronic device or a second audio signal from the external electronic device can be played by the audio output element. The detecting module detects the connection status of the support base. According to the connection status, the first audio signal or the second audio signal is controlled to be outputted from the audio output element.

10 Claims, 9 Drawing Sheets

SUPPORT BASE

CROSS-REFERENCE TO RELATED APPLICATION

This application claims priority to U.S. Provisional Patent Application No. 62/937,584 filed Nov. 19, 2019, the contents of which are incorporated herein by reference.

FIELD OF THE INVENTION

The present invention relates to a support base, and more particularly to a support base for supporting a portable electronic device and assisting the user in operating the portable electronic device.

BACKGROUND OF THE INVENTION

Recently, a variety of electronic devices are developed toward small size, light weightiness and easy portability. Consequently, the electronic devices are favored by users. The electronic device is usually equipped with a touch screen. The user can input commands through the touch screen. Consequently, the electronic device can be intuitively operated by the user. The common electronic devices include for example smart phones, tablet computers, personal digital assistants (PDAs), handheld game consoles (e.g. PSP, NDSL and Gameboy series game consoles), and the like.

When the user sits in front of a desk to do an office work or read a book, the electronic device is usually placed on the surface of the desk in a flat placement manner. Since the touch screen faces upwardly, the contents shown on the touch screen can be directly watched by the user. However, when the electronic device is placed on the surface of the desk in the flat placement manner, there is an angle difference between the touch screen and the vision of the user sitting in front of the desk. Since the user's vision is not in parallel with the touch screen, the electronic device cannot be operated easily.

For solving the above drawbacks, a dedicated support base for the electronic device has been introduced into the market. The support base can be placed on the surface of the desk. In addition, the electronic device is supported by the support base in an inclined manner. Due to the support base, the user's vision can be in parallel with the touch screen. Consequently, the electronic device can be operated more easily. However, the conventional support base still has some drawbacks. For example, when the electronic device is placed on the support base, the charging port of the electronic device is sheltered by the electronic device. Under this circumstance, the electronic device cannot be charged. Moreover, the conventional support base only provides the function of supporting the electronic device. That is, the conventional support base cannot provide other auxiliary functions.

Therefore, there is a need of providing an improved support base to provide auxiliary functions according to various requirements.

SUMMARY OF THE INVENTION

An object of the present invention provides a support base for supporting a portable electronic device while providing auxiliary functions according to various requirements.

Another object of the present invention provides a support base that has a small size and is easily carried.

In accordance with an aspect of the present invention, a support base is provided for supporting a portable electronic device thereon. The support base includes a casing, a signal transmission module, at least one connection port, an audio output element and a detecting module. The signal transmission module is disposed within the casing, and wirelessly connected with the portable electronic device. The signal transmission module transmits a first electronic data to the portable electronic device or receives the first electronic data from the portable electronic device. The at least one connection port is installed in the casing, and connected with an external electronic device through at least one connection wire. The at least one connection port transmits a second electronic data to the external electronic device or receives the second electronic data from the external electronic device. The audio output element is disposed within the casing and connected with the signal transmission module and the at least one connection port. A first audio signal of the first electronic data from the portable electronic device or a second audio signal of the second electronic data from the external electronic device is outputted from the audio output element. The detecting module is disposed within the casing and electrically connected with the signal transmission module and the at least one connection port. The detecting module detects whether the signal transmission module is connected with the portable electronic device or the at least one connection port is connected with the external electronic device. If the detecting module detects that the signal transmission module is wirelessly connected with the portable electronic device, the audio output element outputs the first audio signal of the first electronic data. If the detecting module detects that the at least one connection port is connected with the external electronic device through the at least one connection wire, the audio output element outputs the second audio signal of the second electronic data.

In an embodiment, the support base further includes a switching button, and the switching button is installed on the casing. When the switching button is triggered, the first audio signal of the first electronic data is controlled to be outputted from the audio output element or the second audio signal of the second electronic data is controlled to be outputted from the audio output element.

In an embodiment, the support base further includes a shape-changeable module. The shape-changeable module is installed on the casing. The shape-changeable module includes a support frame, a movable plate and a movable stand. The support frame is disposed within the casing. The movable plate is installed on the support frame and exposed to a front surface of the casing. When the movable plate is moved relative to the casing along a first direction, a shape of the support base is changed. The movable stand is installed on the front surface of the casing, and located under the movable plate. When the movable stand is moved relative to the casing along a second direction, the shape of the support base is changed. Consequently, a lateral edge of the portable electronic device is contactable with the movable stand.

From the above descriptions, the present invention provides the support base. The required components or modules can be installed in the support base according to the practical requirements. Consequently, the support base can provide various auxiliary functions to the user. The auxiliary functions at least contain the wireless charging function or the audio input/output function. In addition, the size of the support base of the present invention is similar to that of the portable electronic device. Consequently, the support base is suitably carried in the business trip or the travel trip.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
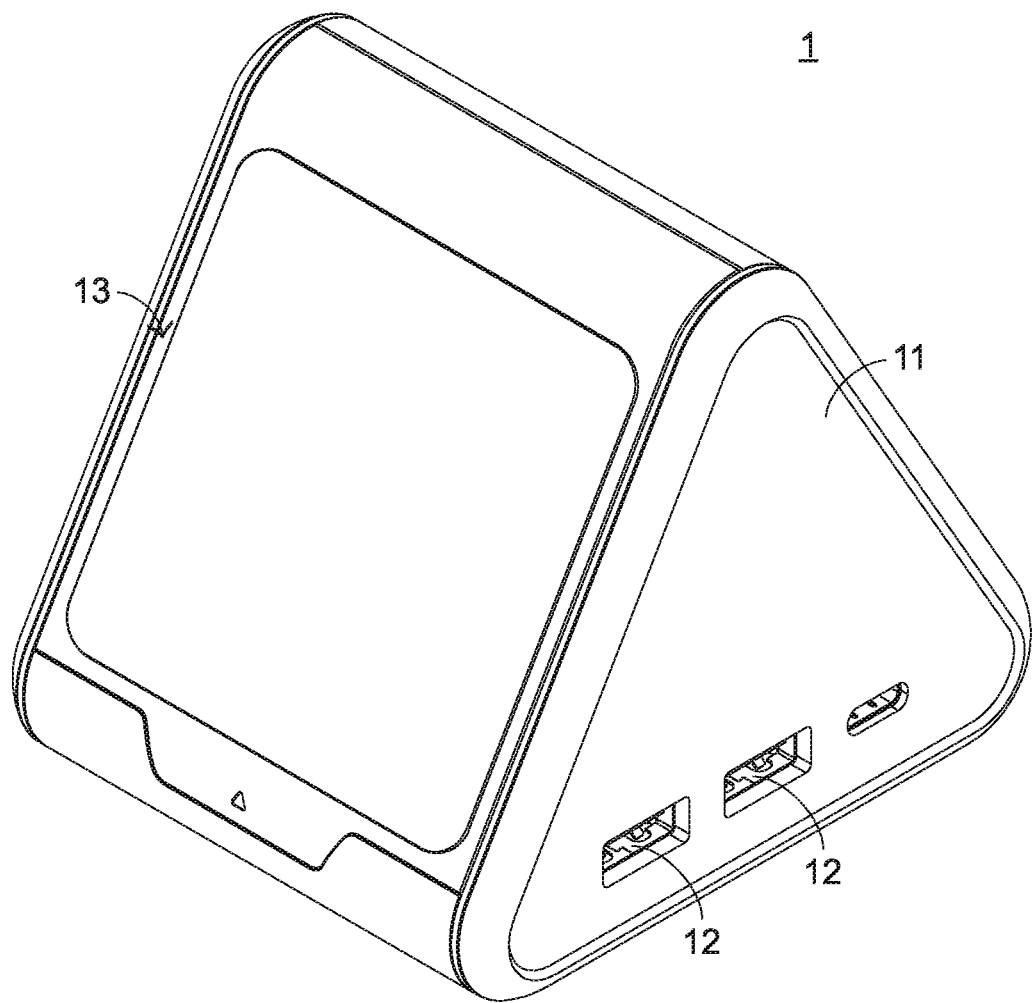
FIG. 1 is a schematic perspective view illustrating a support base according to a first embodiment of the present invention.

The present invention provides a support base in order to overcome the drawbacks of the conventional technologies. The embodiments of present invention will be described more specifically with reference to the following drawings. For well understanding the present invention, the elements shown in the drawings are not in scale with the elements of the practical product. In the following embodiments and drawings, the elements irrelevant to the concepts of the present invention or the elements well known to those skilled in the art are omitted. It is noted that numerous modifications and alterations may be made while retaining the teachings of the invention. In the following embodiments, an example of the portable electronic device to be supported by the support base includes a mobile phone. It is noted that the application of the support base is not restricted.

Figure 2:
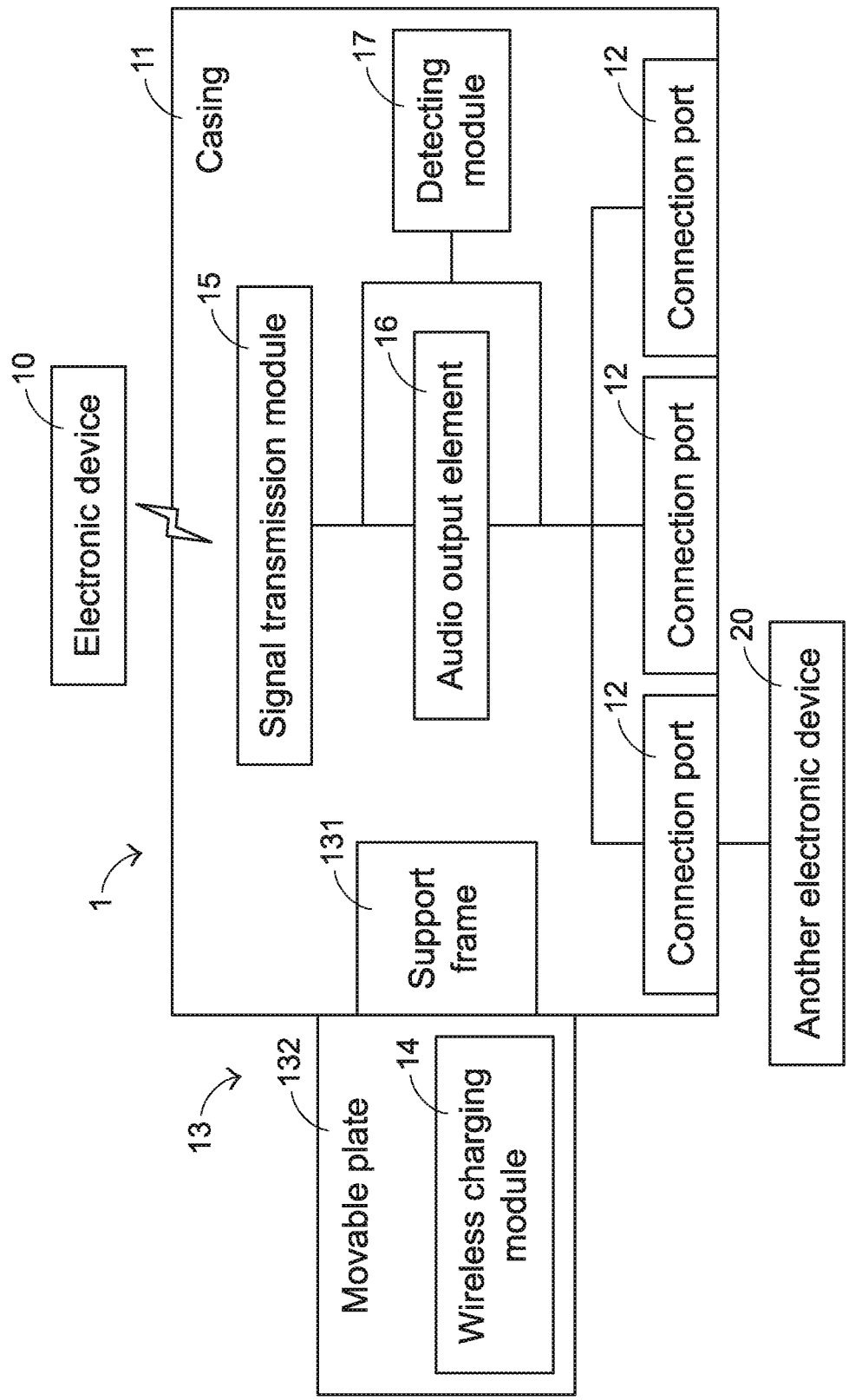
FIG. 2 is a schematic circuit block diagram illustrating the relationship between the components of the support base according to the first embodiment of the present invention.
Figure 5:
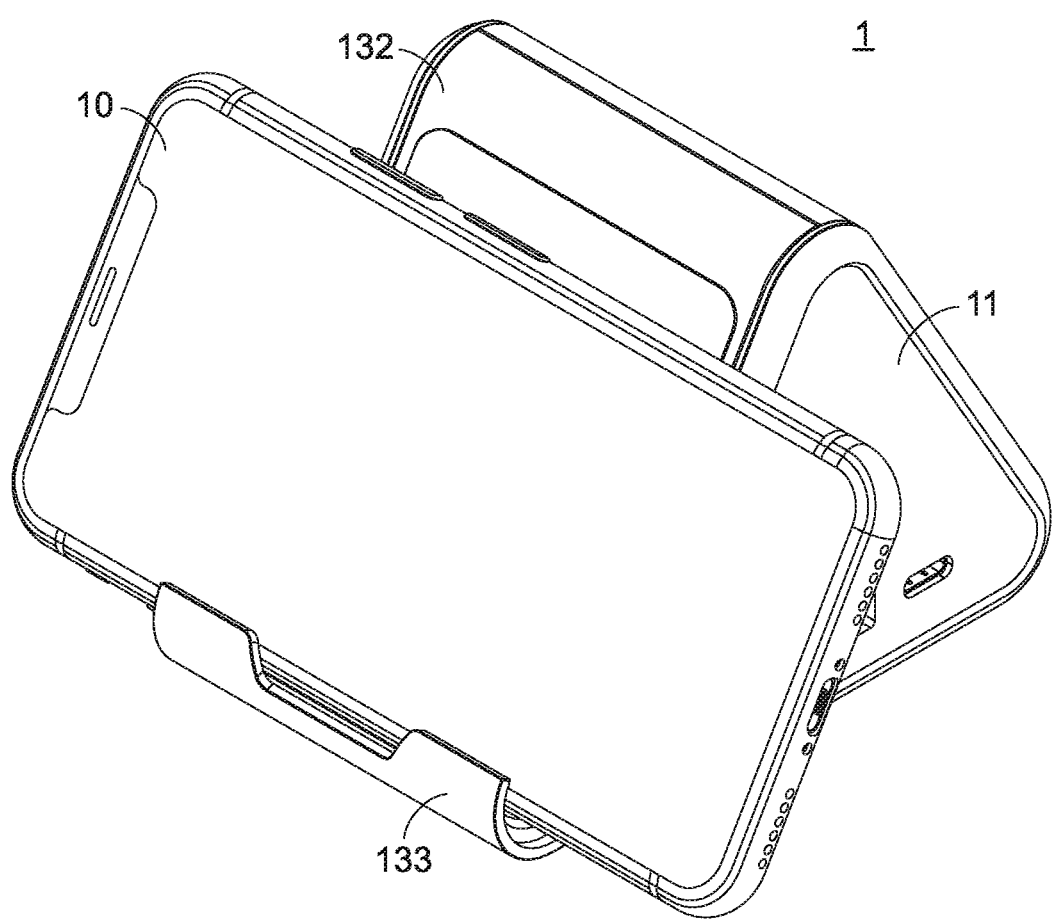
FIG. 5 schematically illustrates the use of the support base of the present invention to support the portable electronic device in a horizontal placement manner.
Figure 6:
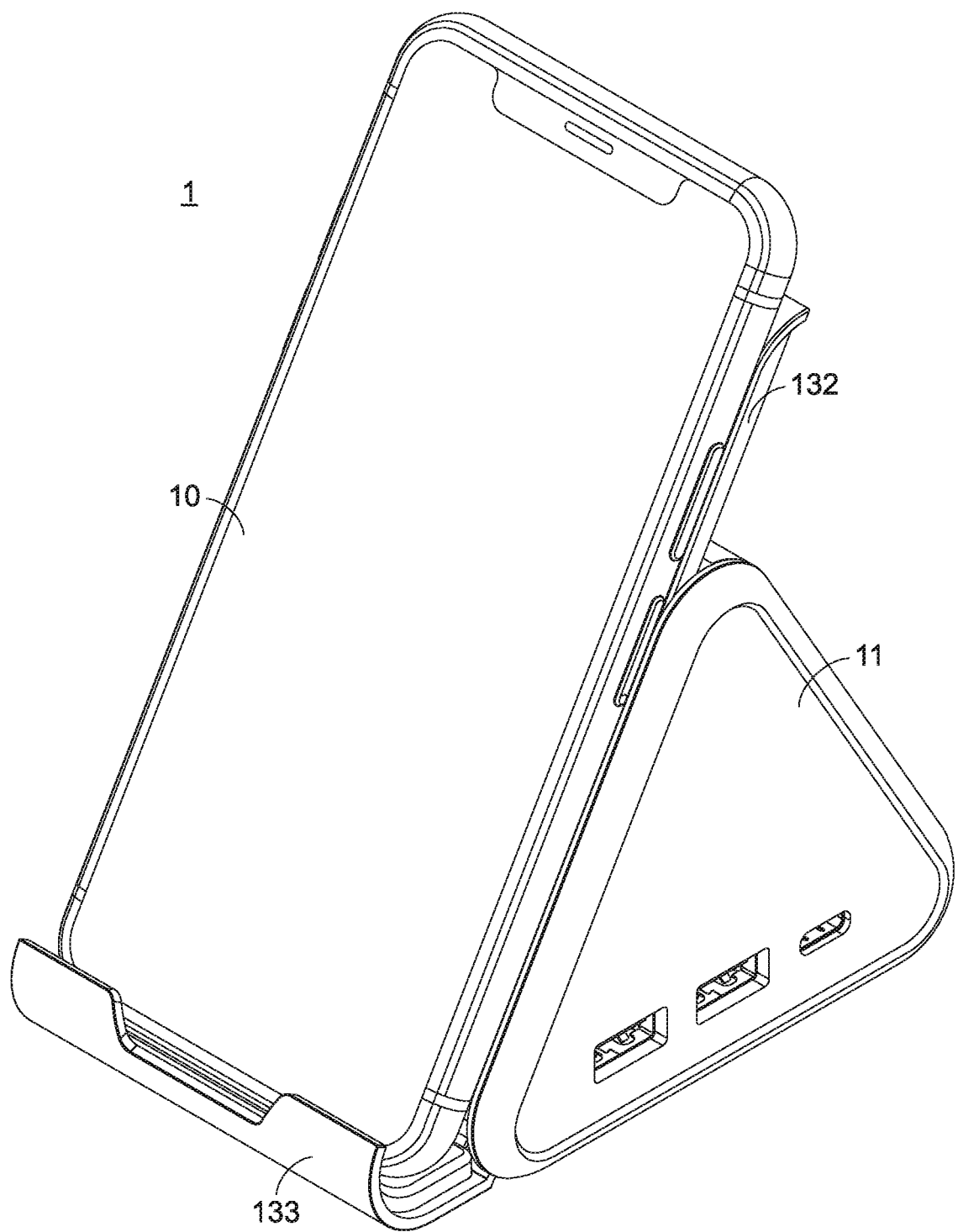
FIG. 6 schematically illustrates the use of the support base of the present invention to support the portable electronic device in a vertical placement manner.

Please refer to FIGS. 1 and 2. FIG. 1 is a schematic perspective view illustrating a support base according to a first embodiment of the present invention. FIG. 2 is a schematic circuit block diagram illustrating the relationship between the components of the support base according to the first embodiment of the present invention. The support base 1 comprises a casing 11, plural connection ports 12, a shape-changeable module 13, a wireless charging module 14, a signal transmission module 15, an audio output element 16 and a detecting module 17. As shown in FIG. 1, the casing 11 has a triangular prism structure. Consequently, as shown in FIG. 5 or FIG. 6, a portable electronic device 10 is suitably supported on the casing 11. The plural connection ports 12 are installed on the casing 11. At least one external electronic device 20 can be connected with the corresponding connection port 12 through a corresponding connection wire (not shown). Consequently, the support base 11 can transmit or receive the electronic data from the at least one external electronic device 20.

The number of the connection ports 12 may be determined according to the size of a lateral surface of the casing 11. For example, the connection port 12 is a USB port, a HDMI port, a Display port or a SD card slot. It is noted that the example of the connection port 12 is not restricted.

Please refer to FIG. 2 again. The signal transmission module 15 is disposed within the casing 11 and electrically connected with the plural connection ports 12. The signal transmission module 15 is in communication with the portable electronic device 10 in a wireless transmission manner. Preferably but not exclusively, the signal transmission module 15 is a Bluetooth transmission module. Due to the arrangement of the signal transmission module 15 and the plural connection ports 12, the electronic data (e.g., an image file, a video file or an audio file) from an external device can be transmitted to the portable electronic device 10 through the support base 1 in the wireless transmission manner. Consequently, the electronic data can be played by the portable electronic device 10.

The audio output element 16 is disposed within the casing 11. Moreover, the audio output element 16 is connected with the signal transmission module 15 and the plural connection ports 12. According to the selection of the user, the audio signal of the electronic data from the portable electronic device 10 or the audio signal of the electronic data from the external electronic device 20 can be outputted from the audio output element 16.

The detecting module 17 is disposed within the casing 11, and electrically connected with the signal transmission module 15 and the plural connection ports 12. The detecting module 17 can detect whether the signal transmission module 15 is wirelessly connected with the portable electronic device 10. Moreover, the detecting module 17 can detect whether any of the plural connection ports 12 is connected with the external electronic device 20. If the detecting module 17 detects that the signal transmission module 15 is wirelessly connected with the portable electronic device 10, the audio output element 16 is controlled to output the audio signal of the electronic data from the portable electronic device 10. If the detecting module 17 detects that any of the plural connection ports 12 is connected with the external electronic device 20, the audio output element 16 is controlled to output the audio signal of the electronic data from the external electronic device 20.

Figure 3:
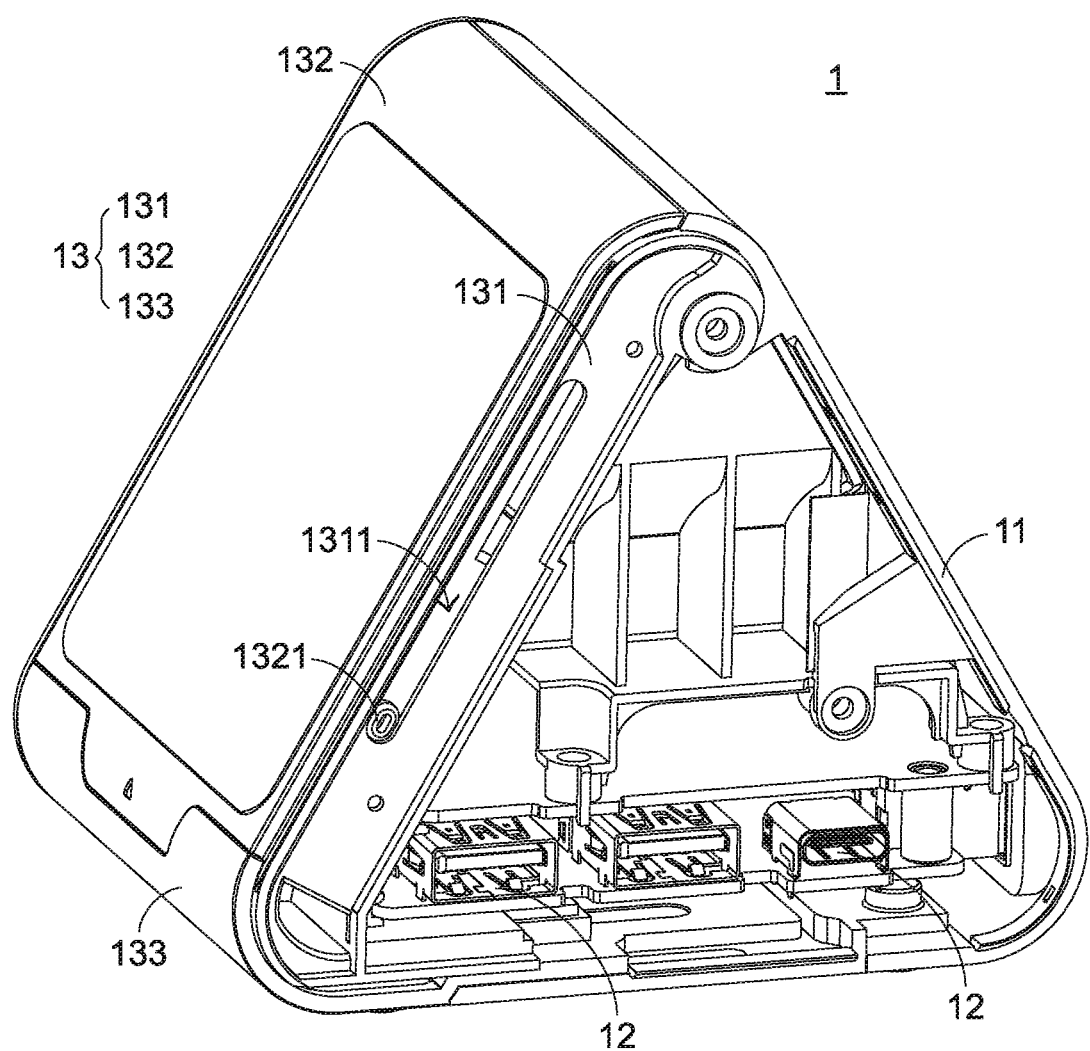
FIG. 3 is a schematic cutaway view illustrating a portion of the support base according to the first embodiment of the present invention.
Figure 4:
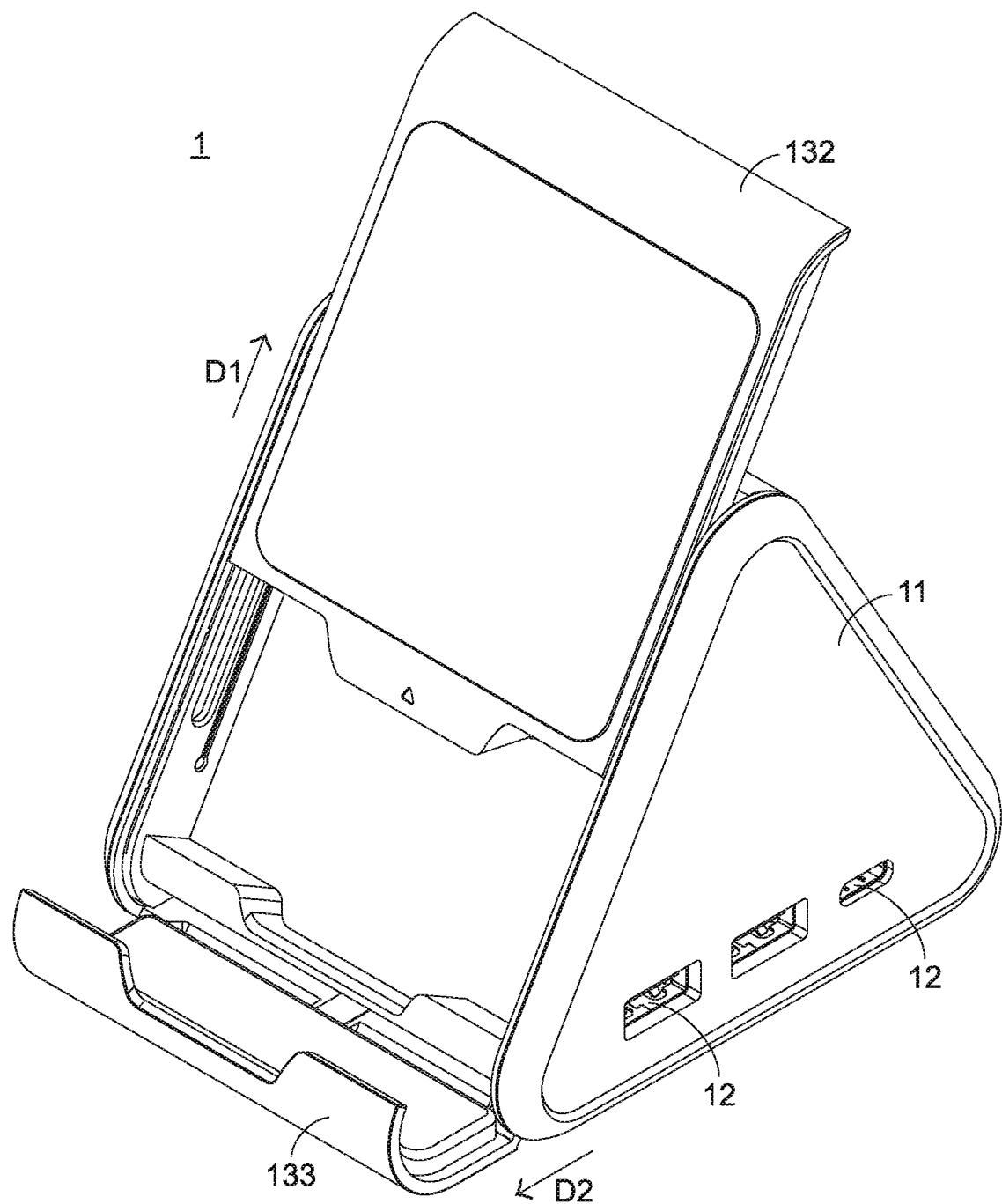
FIG. 4 is a schematic perspective view illustrating the structure of the shape-changeable module of the support base according to the first embodiment of the present invention.

Please refer to FIGS. 3 and 4. FIG. 3 is a schematic cutaway view illustrating a portion of the support base according to the first embodiment of the present invention. FIG. 4 is a schematic perspective view illustrating the structure of the shape-changeable module of the support base according to the first embodiment of the present invention. The shape-changeable module 13 of the support base 1 comprises a support frame 131, a movable plate 132 and a movable stand 133. The support frame 131 is disposed within the casing 11. The movable plate 132 is installed on the support frame 131 and exposed to a front surface of the casing 11. The movable plate 132 is movable relative to the casing 11 along a first direction D1. The first direction D1 is in parallel with the front surface of the casing 11. As the movable plate 132 is moved relative to the casing 11 along the first direction D1, the shape of the support base 1 is changed and the contact area between the casing 11 and the portable electronic device 10 is increased. The movable stand 133 is installed on the front surface of the casing 11 and located under the movable plate 132. The movable stand 133 is movable relative to the casing 11 along a second direction D2. The second direction D2 is in parallel with a bottom surface of the casing 11 or a desk surface. Consequently, the shape of the support base 1 is changeable. When a lateral edge of the portable electronic device 10 is contacted with the movable stand 133, the portable electronic device 10 can be securely fixed on the casing 11. In an embodiment, the support frame 131 comprises a sliding track 1311, and a sliding shaft 1321 is inserted into the sliding track 1311. Consequently, the movable plate 132 is movable relative to the casing 11 along the first direction D1.

Please refer to FIGS. 5 and 6. FIG. 5 schematically illustrates the use of the support base of the present invention to support the portable electronic device in a horizontal placement manner FIG. 6 schematically illustrates the use of the support base of the present invention to support the portable electronic device in a vertical placement manner. When the user intends to place the portable electronic device10 on the support base 1, the user may pull out the movable stand 133 along the second direction D2. Then, the portable electronic device 10 is placed in the space between the movable stand 133 and the front surface of the casing 11 in the horizontal placement manner. The usage status can be seen in FIGS. 4 and 5. When the user intends to place the portable electronic device10 on the support base 1 in the vertical placement manner, the user may pull out the movable plate 132 along the first direction D1. Then, the portable electronic device 10 is placed in the space between the movable stand 133 and the front surface of the casing 11 in the vertical placement manner. The usage status can be seen in FIG. 6. As shown in FIGS. 4, 5 and 6, the size of the support base 1 is very close to the size of the portable electronic device 10. Since the support base 1 is small, the support base 1 can be carried easily.

Figure 7:
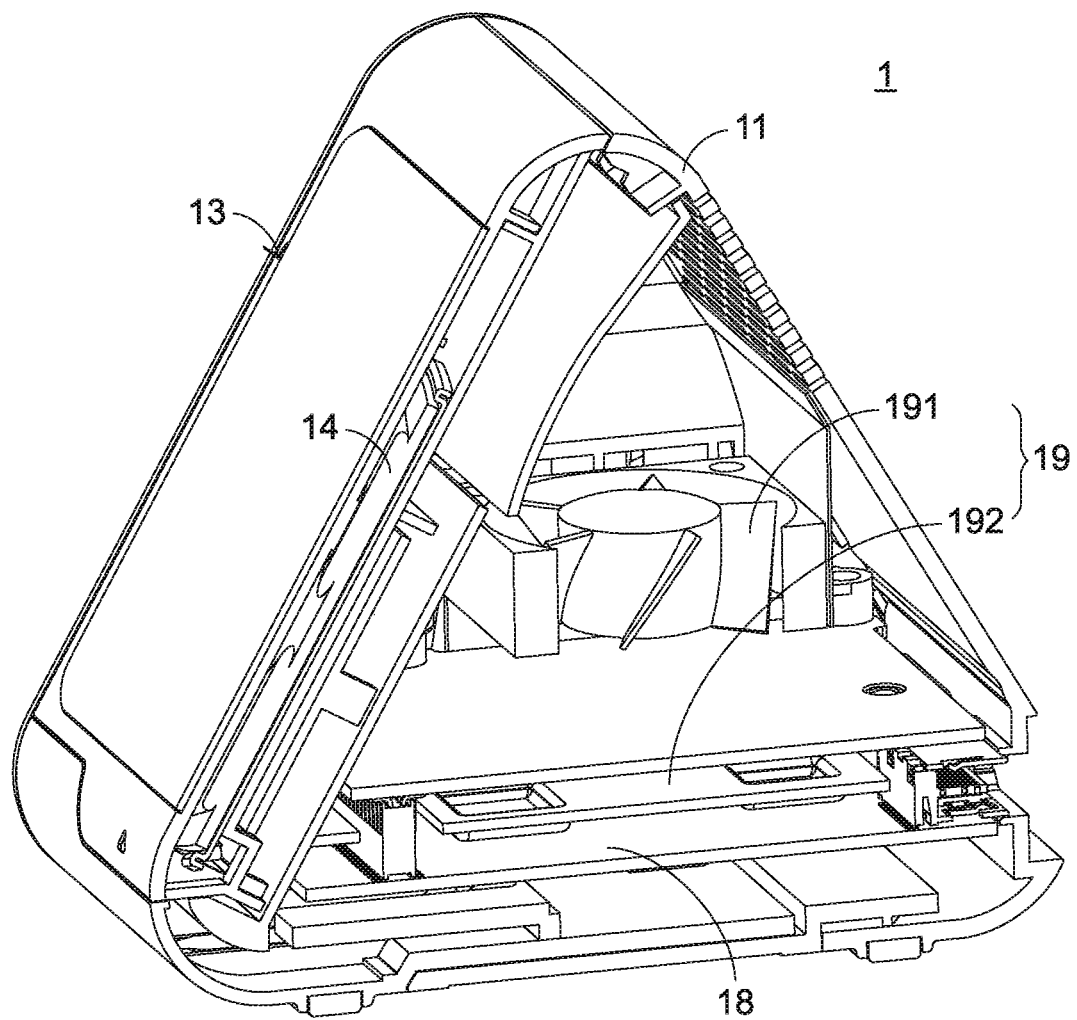
FIG. 7 is a schematic cutaway view illustrating a portion of the support base according to the first embodiment of the present invention and taken along another viewpoint.

In addition to the above components, the support base 1 further comprises a circuit board and a heat dissipation module. FIG. 7 is a schematic cutaway view illustrating a portion of the support base according to the first embodiment of the present invention and taken along another viewpoint. As shown in FIG. 7, the circuit board 18 and the heat dissipation module 19 are disposed within the casing 11. The circuit board 18 is disposed within the casing 11 and electrically connected with the plural connection ports 12. The heat dissipation module 19 is disposed within the casing 11 and located near the circuit board 18. The heat generated by the circuit board 18 can be removed by the heat dissipation module 19. In an embodiment, the heat dissipation module 19 comprises a cooling fan 191 and plural fins 192. The cooling fan 191 is disposed within the casing 11 and located over the circuit board 18. The heat in the casing 11 can be removed by the cooling fan 191. The fins 192 are installed on the circuit board 18 in order to facilitate removing the heat from the circuit board 18.

The following two aspects need to be specially described. Firstly, the wireless charging module 14 may be installed in the movable plate 132 of the casing 11. Consequently, the support base 1 can provide a wireless charging function. Since the wireless charging module 14 is installed in the movable plate 132, the wireless charging module 14 is enabled when the portable electronic device 10 is contacted with the movable plate 132. Consequently, the portable electronic device 10 is wirelessly charged by the wireless charging module 14. The detailed structure and the operation of the wireless charging module 14 are well known to those skilled in the art, and not redundantly described herein. Secondly, the support base 1 may acquire electric power from a chargeable battery (not shown) in the casing 11. Alternatively, the support base 1 may be plugged into a power socket through an external power wire in order to acquire the electric power.

Figure 8:
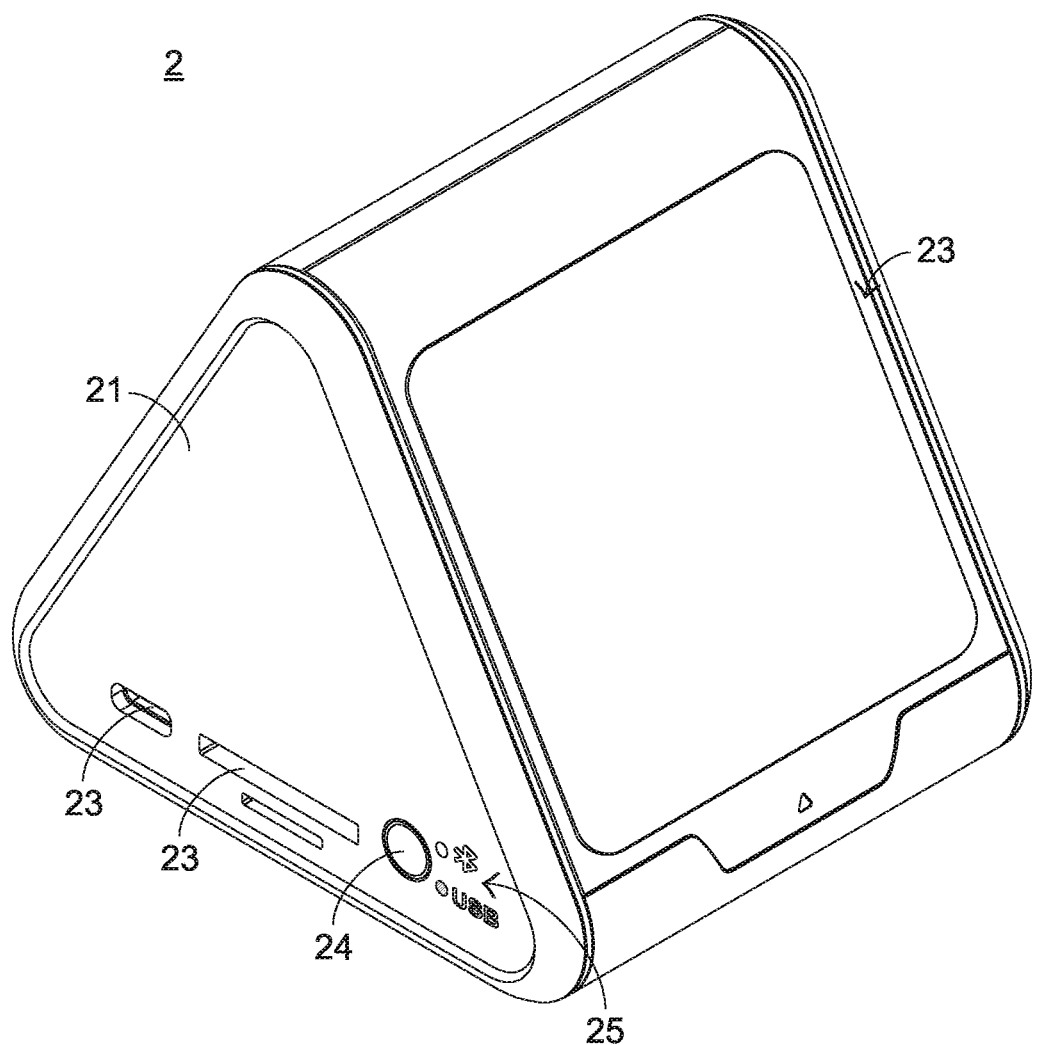
FIG. 8 is a schematic perspective view illustrating a support base according to a second embodiment of the present invention.

The present invention further provides another embodiment of the support base to provide different functions. FIG. 8 is a schematic perspective view illustrating a support base according to a second embodiment of the present invention. The support base 2 comprises a casing 21, plural connection ports 22, a shape-changeable module 23, a signal transmission module (not shown), an audio output element (not shown), a detecting module (not shown), a switching button 24 and an indication element 25. The structures and operations of the casing 21, the signal transmission module, the plural connection ports 22, the shape-changeable module 23, the audio output element and the detecting module are similar to those of the first embodiment, and not redundantly described herein. In comparison with the first embodiment, the support base 2 further comprises the switching button 24 and the indication element 25. The switching button 24 is installed on the casing 21. When the switching button 24 is pressed down by the user, the audio signal of the electronic data from the portable electronic device (not shown) can be outputted from the audio output element. Alternatively, when the switching button 24 is pressed down by the user, the audio signal of the electronic data from the external electronic device can be outputted from the audio output element. Moreover, the support base 2 is wirelessly connected with the portable electronic device through the signal transmission module, and the support base 2 is connected with the external electronic device through the corresponding connection wire and the corresponding connection port 22.

The indication element 25 is installed on the casing 21 and exposed outside the casing 21. According to the source of the audio signal from the audio output element, the indication element 25 displays a connection status of the support base 2. For example, if the audio signal of the electronic data is being played by the portable electronic device (not shown) and the support base 2 is wirelessly connected with the portable electronic device through the signal transmission module, the audio signal of the electronic data can be transmitted from the portable electronic device to the support base 2 through the signal transmission module, and the audio signal can be outputted through the audio output element. At the same time, a first indication signal corresponding to the signal transmission module is generated by the indication element 25. That is, a display light corresponding to the signal transmission module (e.g., a Bluetooth interface display light) is enabled to emit the light beams.

Figure 9:
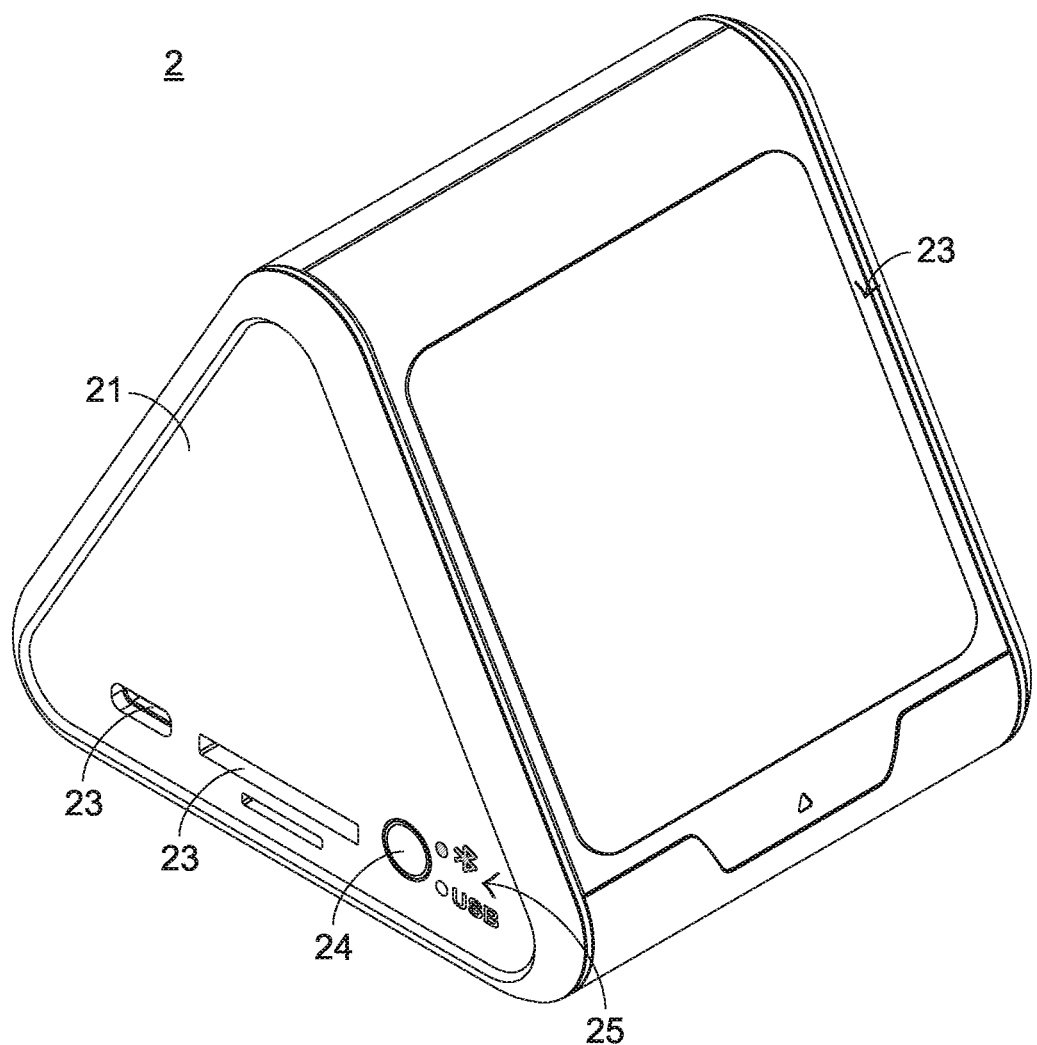
FIG. 9 is a schematic perspective view illustrating the support base according to the second embodiment of the present invention, in which a second indication signal is generated by the indication element.

FIG. 9 is a schematic perspective view illustrating the support base according to the second embodiment of the present invention, in which a second indication signal is generated by the indication element. When the support base 2 is connected with the external electronic device (not shown) through the corresponding connection port 22, the audio signal of the electronic data that is being played by the external electronic device (not shown) can be transmitted to the support base 2 through the corresponding connection port 22 and the corresponding connection wire, and the audio signal can be outputted from the audio output element. At the same time, a second indication signal corresponding to the connection port 22 is generated by the indication element 25. That is, a display light corresponding to the connection port 22 (e.g., a USB interface display light) is enabled to emit the light beams.

From the above descriptions, the present invention provides the support base. The required components or modules can be installed in the support base according to the practical requirements. Consequently, the support base can provide various auxiliary functions to the user. The auxiliary functions at least contain the wireless charging function or the audio input/output function. In addition, the size of the support base of the present invention is similar to that of the portable electronic device. Consequently, the support base is suitably carried in the business trip or the travel trip.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation to encompass all such modifications and similar structures.

What is claimed is:

1. A support base for supporting a portable electronic device thereon, the support base comprising:
    a casing;
    a signal transmission module disposed within the casing, and wirelessly connected with the portable electronic device, wherein the signal transmission module transmits a first electronic data to the portable electronic device or receives the first electronic data from the portable electronic device;
    at least one connection port installed in the casing, and connected with an external electronic device through at least one connection wire, wherein the at least one connection port transmits a second electronic data to the external electronic device or receives the second electronic data from the external electronic device;
    an audio output element disposed within the casing and connected with the signal transmission module and the at least one connection port, wherein a first audio signal of the first electronic data from the portable electronic device or a second audio signal of the second electronic data from the external electronic device is outputted from the audio output element; and
    a detecting module disposed within the casing and electrically connected with the signal transmission module and the at least one connection port, wherein the detecting module detects whether the signal transmission module is connected with the portable electronic device or the at least one connection port is connected with the external electronic device, wherein if the detecting module detects that the signal transmission module is wirelessly connected with the portable electronic device, the audio output element outputs the first audio signal of the first electronic data, wherein if the detecting module detects that the at least one connection port is connected with the external electronic device through the at least one connection wire, the audio output element outputs the second audio signal of the second electronic data.

2. The support base according to claim 1, wherein the support base further comprises a switching button, and the switching button is installed on the casing, wherein when the switching button is triggered, the first audio signal of the first electronic data is controlled to be outputted from the audio output element or the second audio signal of the second electronic data is controlled to be outputted from the audio output element.

3. The support base according to claim 1, wherein the signal transmission module is wirelessly connected with the portable electronic device through a Bluetooth transmission technology.

4. The support base according to claim 1, wherein the at least one connection port is installed in a lateral surface of the casing, and a number of the at least one connection port is determined according to a size of the lateral surface of the casing.

5. The support base according to claim 1, wherein the support base further comprises a shape-changeable module, wherein the shape-changeable module is installed on the casing, and the shape-changeable module comprises:
    a support frame disposed within the casing;
    a movable plate installed on the support frame and exposed to a front surface of the casing, wherein when the movable plate is moved relative to the casing along a first direction, a shape of the support base is changed; and
    a movable stand installed on the front surface of the casing, and located under the movable plate, wherein when the movable stand is moved relative to the casing along a second direction, the shape of the support base is changed, so that a lateral edge of the portable electronic device is contactable with the movable stand.

6. The support base according to claim 5, wherein the support frame comprises a sliding track, and the movable plate comprises a sliding shaft, wherein the sliding shaft is inserted into the sliding track, so that the movable plate is movable relative to the casing along the first direction.

7. The support base according to claim 5, wherein the support base further comprises a wireless charging module, and the wireless charging module is installed in the movable plate, wherein when the portable electronic device is placed on the movable stand and the movable plate, the wireless charging module is enabled to wirelessly charge the portable electronic device.

8. The support base according to claim 1, further comprising:
    a circuit board disposed within the casing, and electrically connected with the at least connection port; and
    a heat dissipation module disposed within the casing, and located near the circuit board, wherein a heat generated by the circuit board is removed by the heat dissipation module.

9. The support base according to claim 8, wherein the heat dissipation module comprises:
    a cooling fan disposed within the casing, and located over the circuit board; and
    plural fins installed on the circuit board.

10. The support base according to claim 1, wherein the support base further comprises an indication element, and the indication element is installed on the casing and exposed outside the casing, so that a connection status of the support base is displayed through the indication element, wherein if the support base is wirelessly connected with the portable electronic device through the signal transmission module, a first indication signal corresponding to the signal transmission module is generated by the indication element, wherein if the support base is connected with the external electronic device through the at least one connection port and the at least one connection wire, a second indication signal corresponding to the at least one connection port is generated by the indication element.

\* \* \* \* \*